(12) United States Patent
Jang et al.

(10) Patent No.: US 7,525,068 B2
(45) Date of Patent: Apr. 28, 2009

(54) HEATING SYSTEM OF BATCH TYPE REACTION CHAMBER AND METHOD THEREOF

(75) Inventors: Taek Yong Jang, Suwon (KR); Byoung Il Lee, Seongnam (KR); Young Ho Lee, Yongin (KR)

(73) Assignee: Terasemicon Co., Ltd, Hwasung, Gyeonggi-Do (KR)

( * ) Notice: Subject to any disclaimer, the term of this patent is extended or adjusted under 35 U.S.C. 154(b) by 293 days.

(21) Appl. No.: 11/513,732

(22) Filed: Aug. 31, 2006

(65) Prior Publication Data

US 2007/0166656 A1  Jul. 19, 2007

(30) Foreign Application Priority Data

Jan. 16, 2006  (KR) ............... 10-2006-0004393
Jul. 24, 2006  (KR) ............... 10-2006-0069261

(51) Int. Cl.
*F27B 5/14* (2006.01)
*F26B 19/00* (2006.01)

(52) U.S. Cl. ............. 219/390; 219/405; 219/411; 392/416; 392/418; 118/724; 118/725; 118/50.1

(58) Field of Classification Search ............ 219/390, 219/405, 411; 392/416, 418; 118/724, 725, 118/50.1
See application file for complete search history.

(56) References Cited

U.S. PATENT DOCUMENTS 6,741,804 B2 *  5/2004  Mack et al. ............ 392/416

* cited by examiner

*Primary Examiner*—Shawntina Fuqua

(57) ABSTRACT

A heating system of a batch type reaction chamber for semiconductor device and a method thereof are disclosed. Each heat unit of heating groups has different height and caloric value at right angles according to the divided areas, thereby it can control an uniform temperature incline of the entire process space of the reaction chamber. Also, the reflecting plates are formed by each heating unit, so that the change of the heating unit can be simple. Furthermore, the divided reflecting blocks are adjacently connected to another reflecting block through the radiant wave shielding slit between them, so that the leakage of the radiant wave can be prevented and the reflecting blocks can be separately attached and deattached to each other. Also, the turning member is formed at the lower portion of the reflecting blocks, so that it can be easily attached and deattached.

10 Claims, 11 Drawing Sheets processing gas

HEATING SYSTEM OF BATCH TYPE REACTION CHAMBER AND METHOD THEREOF

BACKGROUND OF THE INVENTION

1. Field of the Invention

The present invention relates to a heating system of a batch type reaction chamber and a method thereof, and more particularly to a heating system of a batch type reaction chamber and a method thereof, in that a heating group having a plurality of heaters for forming divided heating areas of a process space at right angles and having a pair of heating units as a heating element connected to each supplying line through separate thermostats is provided, so that each heat unit has different height and caloric value at right angles according to the divided areas, whereby it can control an uniform temperature incline of the entire process space of the reaction chamber.

2. Description of the Prior Art

Generally, a semiconductor manufacturing process or a LCD and a PDP manufacturing process includes a plurality of heat treatment process. For example, the heat treatment process as a unit process is contained in a thin-film deposition process, an activation process or a crystallization process.

In the CVD (Chemical Vapor Deposition) process, an aerial chemical compound is reacted on a heated surface of the basic material to deposit a product on the surface of the basic material. Especially, the process is very important to the production process such as a flat board display substrate (for example, LCD, PDP and so on).

FIG. 1 illustrates a semiconductor manufacturing device for depositing a silicon film on the semiconductor substrate as a CVD (Chemical Vapor Deposition) device. That is, FIG. 1 illustrates a batch type process device for treating a plurality of substrates.

The minute structure and growth result of the thin film is determined by the nucleation process and the surface diffusion on the growth interface. Also, they are influenced by the temperature of the substrate, the pressure of the reactor and the gas composition. Moreover, the change of the minute structure is generated owing to the heat treatment or the following process. Here, the change has a direct impact on the characteristic of the thin film.

As shown in FIG. 1A, the semiconductor manufacturing device includes a reaction chamber 1 for providing a process space, a heater 2 for producing an environment of a heat treatment in the reaction chamber 1, and a gas supplying device (not shown) for supplying a source gas as the material of the thin film. Here, a gas line 7 is connected to the reaction chamber 1.

Also, the semiconductor manufacturing device includes a gas discharging device for discharging a corrosive gas or a poisonous gas contained in a cold trap or scrubber and so on and a transferring device for maintaining a cleanness of the process.

Moreover, as shown in FIG. 1B, a batch type boat 3 for mounting the plurality of semiconductor substrate 100 includes a lifting device 4 for putting it into the reaction chamber 1 and an end-effector 5 for loading and unloading the semiconductor substrates 100.

In the meantime, the heating apparatus 2 for producing the environment of a heat treatment in the reaction chamber 1 is provided. In order to treat the plurality of the semiconductor substrate putted into the batch type reaction chamber in the type of resistance heating, a heater 6 of a coil type is mainly used.

In the heating apparatus 2 of the batch type, the heating area is divided into upper and lower ones, which are separately controlled and driven by sects. Also, the generation of heat is performed through a temperature controller (not shown) by stages.

In the meantime, in the conventional heating apparatus, the heat treatment processes are performed in one reaction chamber under the different environments in temperature in order to promptly treat each process. Accordingly, it is necessary to improve the productivity thereof through sudden rise and fall in temperature and control the supply of an unnecessary calory for maintaining the characteristics of the semiconductor element. For this reason, the heating apparatus for rising and falling the temperature at high speed has been demanded so as to minimize an over-head time necessary to reach the temperature of each process.

That is, the reason is that the semiconductor process includes a plurality of heat treatment processes and the reduction of the process time is essential to maximize the productivity thereof.

However, in the conventional heating apparatus of the resistance heating type, there is a problem in that the process time is delayed in heat treatment.

That is, quite a time is required to increase the temperature of the heat treatment on account of the property of matter of the heating coil itself, thereby the process is delayed. Also, since the heating coil is surrounded by an adiabatic body (an adiabatic block 8), quite a time is required to cool it after the completion of the process.

Accordingly, on account of the delay of each process, the entire process is also, delayed, thereby leading to the lowering of the productivity thereof.

For this reason, a RTP device of a single wafer type for rising and falling the temperature at high speed used in the batch type process has been demanded. In this case, a graphite, a MoSi2 (a kanthal super), a silicon carbide and so on can be used as the heating resistance body. However, it is difficulty to form the coil shape such as the electronic heater owing to the forming characteristics thereof. Accordingly, as shown in FIG. 1C, a plurality of pole type heaters 9 is vertically and separately formed along the outer circumference of the reaction chamber 1.

However, in the conventional RTP device, there are problems in it is difficulty to minutely control the process temperature and cannot cope with the various environment in heat treatment.

For example, since the pyrolysis temperature of the source gas and the temperature of the semiconductor substrate have a strong impact on the deposition speed and the particle producing speed as well as the composition and minute organization of the product, it is necessary to minutely control the temperature of the heating apparatus.

That is, in the above heat treatment processes, it is necessary to produce a uniform temperature over the entire space of the reaction chamber. Here, the heat of the heating apparatus 2 is transmitted to the interior of the reaction chamber 1 through a radiation. Meanwhile, in the inside of the reaction chamber, the heat is transmitted through the radiation and convection.

Here, because the process space of the batch type is several tens times as large as that of the single wafer type in volume, in order to control a uniform temperature incline of the entire process space of the reaction chamber 1 through the heating apparatus, it is necessary to vertically control the temperature of the process space by sects.

Generally, the temperature of the upper portion of the reaction chamber 1 is higher than that of lower portion thereof owing to the convection. Accordingly, in order to control a uniform temperature incline of the entire process space of the reaction chamber 1, it is necessary to heat the upper portion thereof lowly in comparison with the lower portion. Actually, in the electronic heater of the coil type, the heating units as the heat coil divided into upper and lower portions are separately controlled in order to produce the uniform temperature of the entire process space.

However, in the conventional heating unit for the RTP, since the plurality of the heating units of the linear pole type is vertically formed, it is difficulty to produce different temperatures by sects. Also, there is a problem in that it can bring about a badness thereof in the plurality of unit processes for a heat treatment.

SUMMARY OF THE INVENTION

Accordingly, the present invention has been made to solve the above-mentioned problems occurring in the prior art, and an object of the present invention is to provide a heating system of a batch type reaction chamber and a method thereof, in that a heating group having a plurality of heaters for forming divided heating areas of a process space at right angles and having a pair of heating units as a heating element connected to each supplying line through separate thermostats is provided, so that each heat unit has different height and caloric value at right angles according to the divided areas, whereby it can control an uniform temperature incline of the entire process space of the reaction chamber.

To accomplish the object, the present invention provides a heating system of a batch type reaction chamber comprising: the reaction chamber of the batch type for forming a process space; a heating apparatus having a plurality of heating groups formed along an outer circumference of the reaction chamber, the heating group having a plurality of heaters for forming divided heating areas at right angles and having a pair of heating units as a heating element connected to each supplying line having separate thermostats; and a reflecting device having a reflecting plate for reflecting the radiant heat of the heating apparatus toward an inside of the reaction chamber arranged around the heating apparatus and a cooling waterway for exchanging a heat and preventing a heat damage owing to a heating of the heating apparatus.

Preferably, in the heating group, the same heating units share the supplying line having one thermostat with each other.

Preferably, the heating unit is in the form of a character "U".

Preferably, the heating unit is in the form of a character "U" and a horizontal connecting portion of the heating unit is an additional heating portion.

Preferably, the reflecting device comprises a reflecting block for surrounding the heating apparatus, the cooling waterway for cooling the heat transmitted to the inside of the reflecting block, and the reflecting plate coated on the inner surface of the reflecting block by means of a reflecting material.

Preferably, a material of the reflecting block is an aluminum alloy.

Preferably, a noble metal having a good reflexibility such as a gold or a silver is coated on the reflecting plate so as to ensure a reflecting coating layer for reflecting a radiant wave.

Preferably, in the reflecting device, a divided reflecting block is mounted at one heating unit through a bracket.

Preferably, a connecting pipe is mounted at an outside of the divided reflecting block in order to connect the cooling waterway formed at an inside of the reflecting device to it.

Preferably, a plurality of shielding plates for assembling the reflecting blocks is formed at the boundary regions between the reflecting blocks.

Preferably, the reflecting block is adjacently connected to another reflecting block through a radiant wave shielding slit between them in order to prevent the radiant wave from being emitted outside through the boundary thereof.

Preferably, the radiant wave shielding slit comprises an inlet slit formed at the reaction chamber side, an outlet slit deviated from the inlet slit at a predetermined angle, first shielding slit portions extending from the inlet and outlet slit portions respectively, and a second shielding slit portion between the first shielding slit portions and formed at a circumferences of a concentric circle of the reflecting block in order to constitute bent prominence and depression portions and connect them to each other.

Preferably, the radiant wave shielding slit comprises an inlet slit formed at the reaction chamber side, an outlet slit deviated from the inlet slit at a predetermined angle, first shielding slit portions extending from the inlet and outlet slit portions respectively, and a second slanted slit portion slanted between the first shielding slit portions in order to allow the reflecting blocks to be attached and deattached and shield the remnant radiant wave radiated through the inlet slit and the first shielding slit portion.

Preferably, the radiant wave shielding slit comprises an inlet slit formed at the reaction chamber side, an outlet slit deviated from the inlet slit at a predetermined angle, and a shielding slit bent between the inlet slit and the outlet in order to allow the reflecting blocks to be attached and deattached and shield the emission of the radiant wave.

Preferably, a turning member is formed at the lower portion of the reflecting blocks so as to escape the interference with the peripheral device and an upper combination panel is formed on the reflecting blocks to constitute the reflecting device of a cylinder shape.

BRIEF DESCRIPTION OF THE DRAWINGS

The above as well as the other objects, features and advantages of the present invention will be more apparent from the following detailed description taken in conjunction with the accompanying drawings, in which.

DETAILED DESCRIPTION OF THE PREFERRED EMBODIMENTS

A preferred embodiment of the invention will be described in detail below with reference to the accompanying drawings.

Figure 1A:
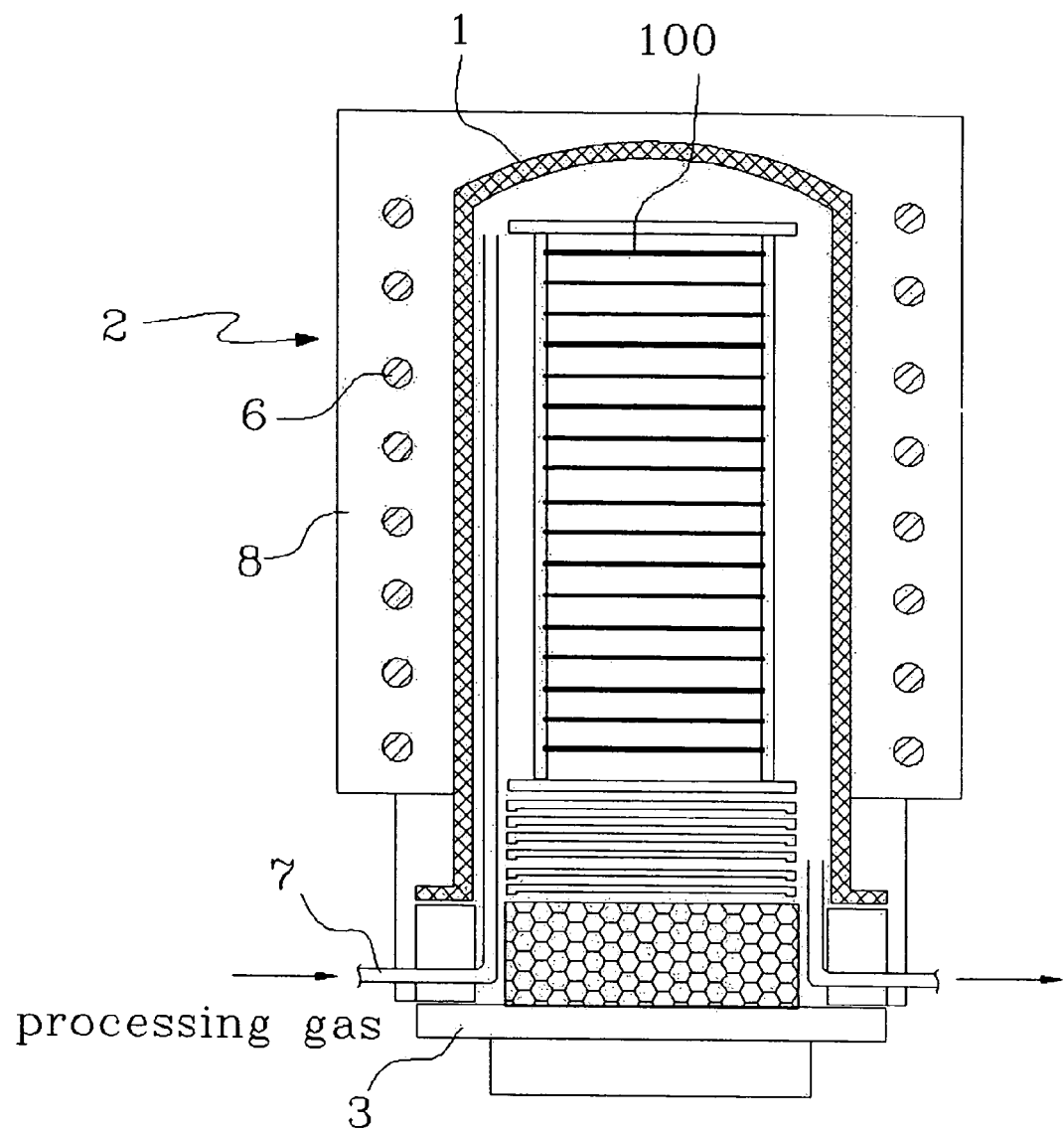
FIG. 1A through FIG. 1C is explanatory views illustrating an external appearance of a conventional semiconductor manufacturing device.
Figure 1B:
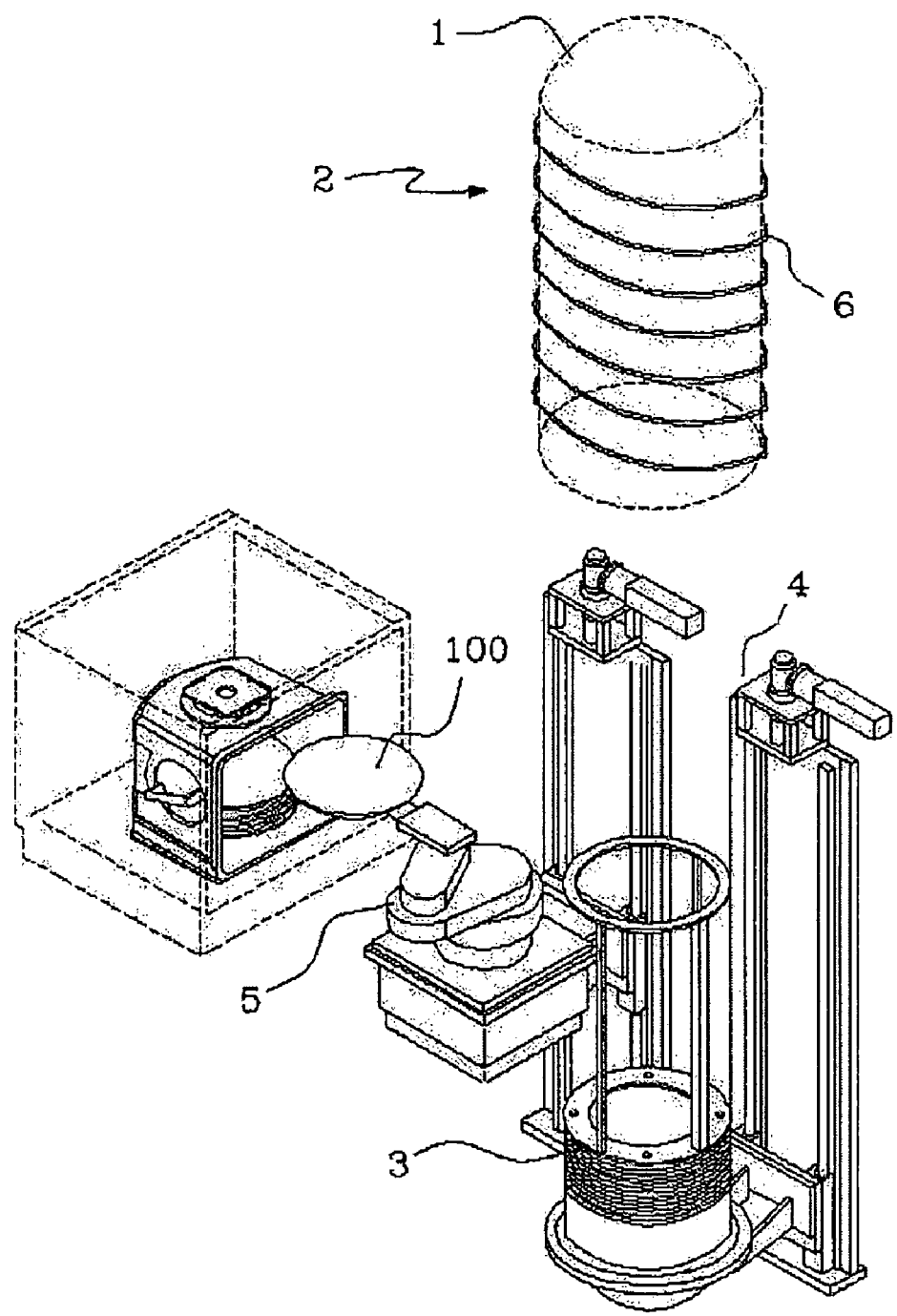
Figure 1C:
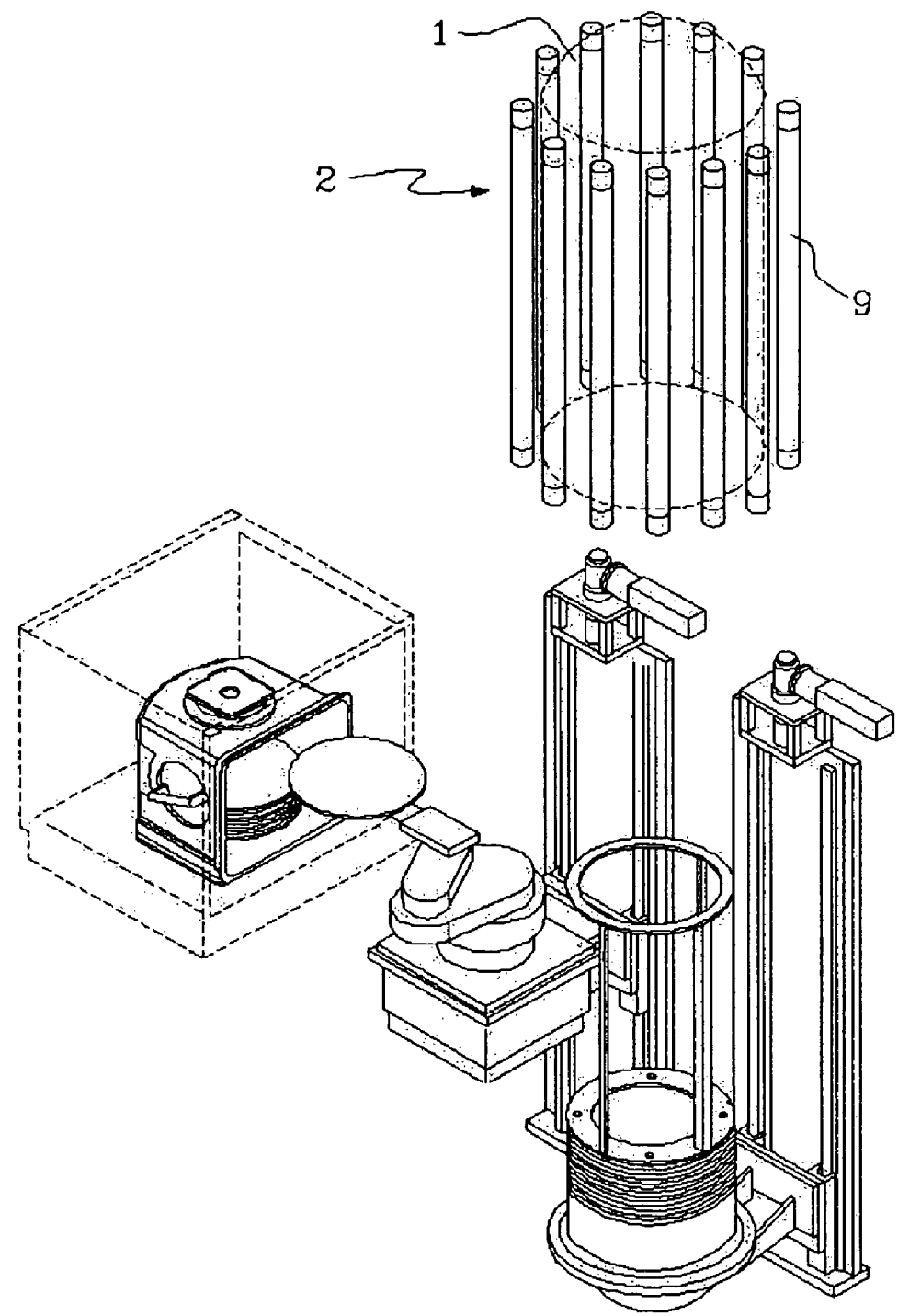
Figure 2:
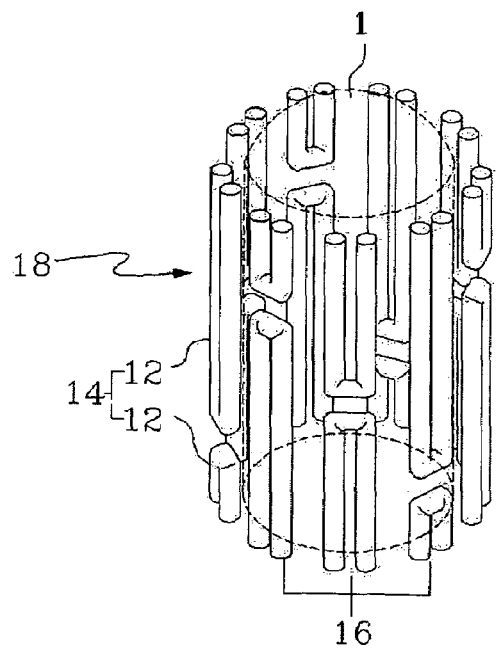
FIG. 2 is an explanatory view illustrating an external appearance of a heating apparatus according to the present invention.
Figure 3:
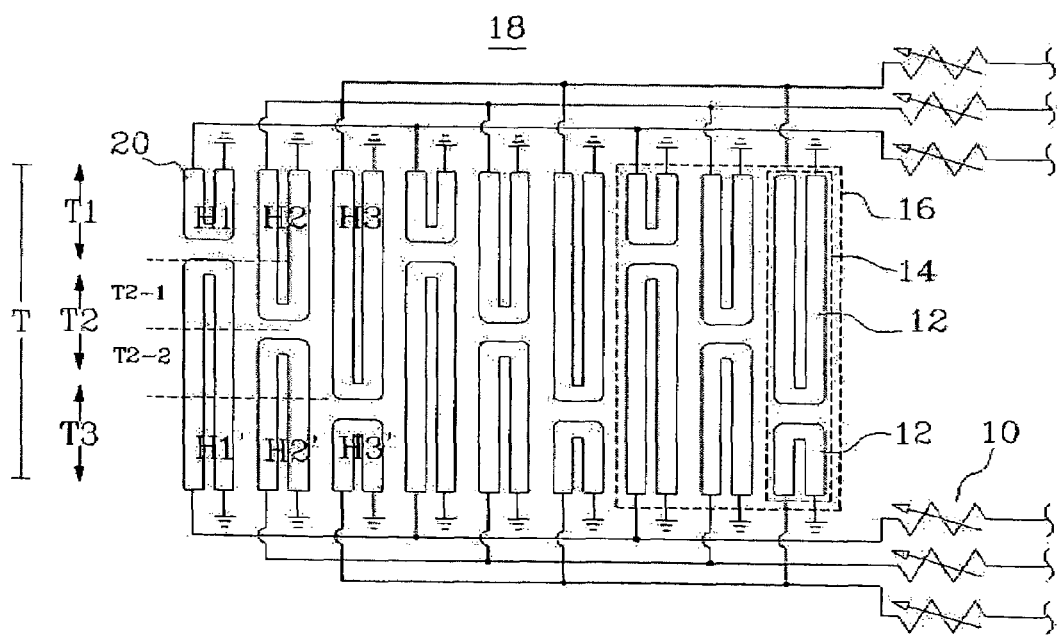
FIG. 3 is an explanatory view illustrating a heating apparatus according to the present invention.

As shown in FIG. 2 and FIG. 3, a method of heating a batch type reaction chamber using a heating system according to the present invention wherein the heating system includes a reaction chamber 1 of a batch type for forming a process space, a heating apparatus 18 having a plurality of heating groups 16 formed gradually along an outer circumference of the reaction chamber 1, the heating group 16 having a plurality of heaters 14 for forming divided heating areas T at right angles and having a pair of heating units 12 as a heating element connected to each supplying line including separate thermostats 10, and a reflecting device 26 having a reflecting plate 22 for reflecting the radiant heat of the heating apparatus 18 toward an inside of the reaction chamber 1 arranged around the heating apparatus 18 and a cooling waterway 24 for exchanging a heat and preventing a heat damage owing to a heating of the heating apparatus 18.

Figure 4A:
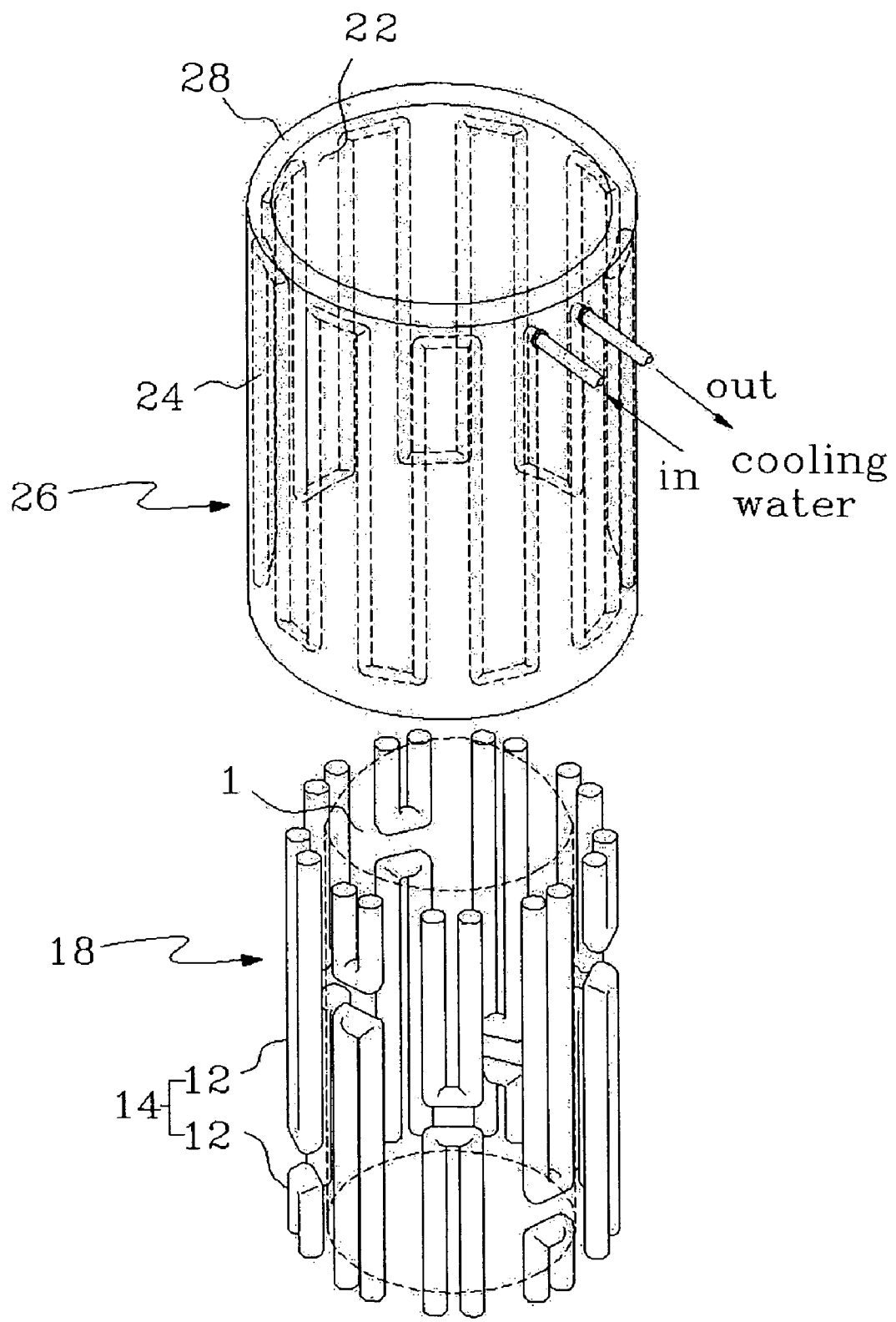
FIG. 4A is an explanatory view illustrating an external appearance of a heating apparatus and a reflecting device according to the present invention.
Figure 4B:
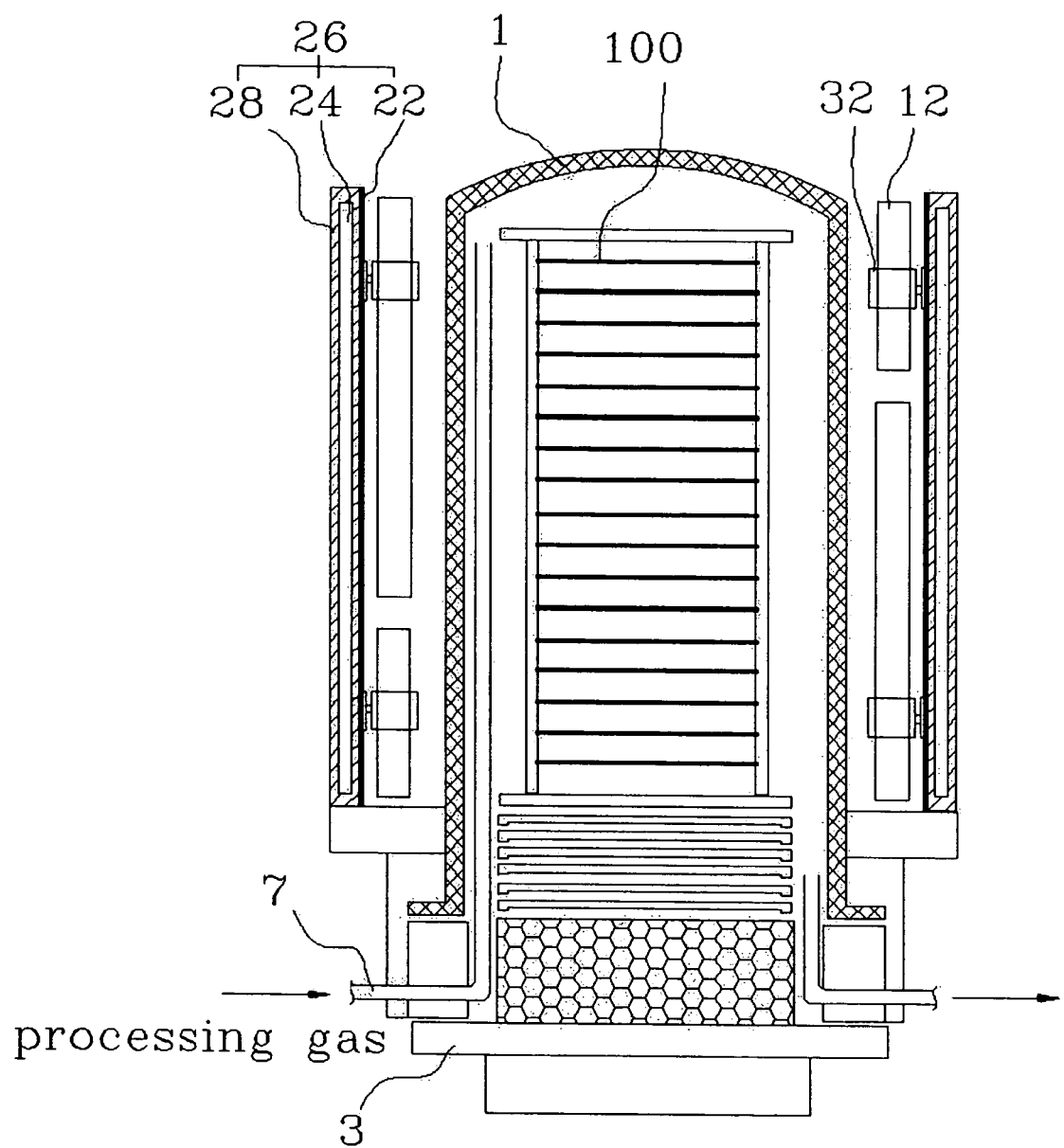
FIG. 4b is a side sectional view of FIG. 4A.

As shown in FIG. 2 through FIG. 4, a heating system of a batch type reaction chamber according to the present invention includes a reaction chamber 1 of a batch type for forming a process space, a heating apparatus 18 having a plurality of heating groups 16 formed along an outer circumference of the reaction chamber 1, the heating group 16 having a plurality of heaters 14 for forming divided heating areas T at right angles and having a pair of heating units 12 as a heating element connected to each supplying line including separate thermostats 10, and a reflecting device 26 having a reflecting plate 22 for reflecting the radiant heat of the heating apparatus 18 toward an inside of the reaction chamber 1 arranged around the heating apparatus 18 and a cooling waterway 24 for exchanging a heat and preventing a heat damage owing to a heating of the heating apparatus 18.

Here, in the heating group 16, the same heating units 12 share the supplying line including one thermostat with each other.

Also, the heating unit 12 is in the form of a character "U" and a horizontal connecting portion of the heating unit 12 is an additional heating portion 20.

The reflecting device 26 includes a reflecting block 28 for surrounding the heating apparatus 18, the cooling waterway 24 for cooling the heat transmitted to the inside of the reflecting block 28, and the reflecting plate 22 coated on the inner surface of the reflecting block 28 by means of a reflecting material.

Here, the material of the reflecting block 28 is an aluminum alloy.

Also, the noble metal having a good reflexibility such as a gold or a silver is coated on the reflecting plate 22 so as to ensure a reflecting coating layer for reflecting a radiant wave.

Figure 5:
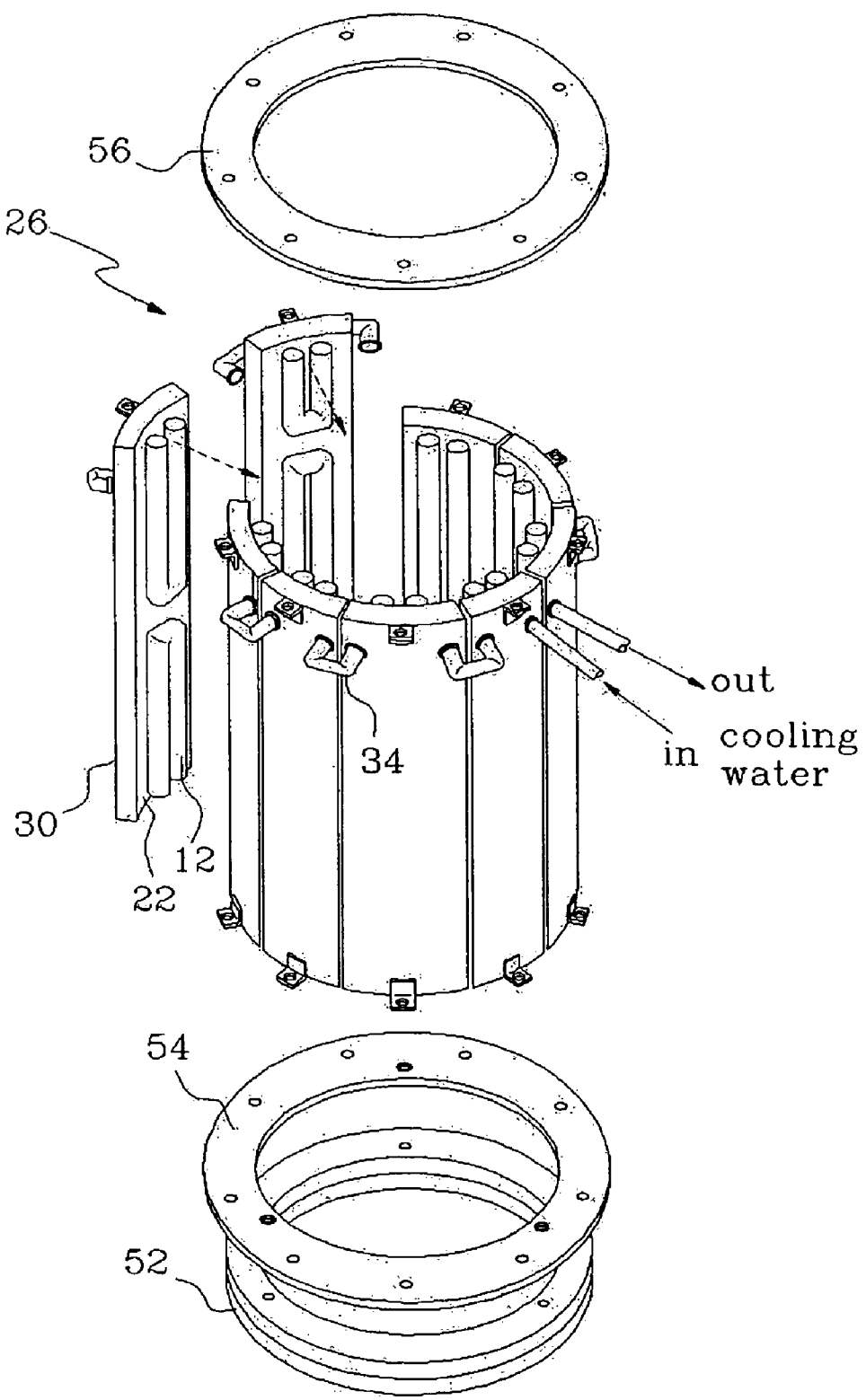
FIG. 5 is an explanatory view illustrating an external appearance of a reflecting device mounted by each heating unit according to the present invention.

As shown in FIG. 5, in the reflecting device 26, a divided reflecting block 30 is mounted at one heating unit 12 through a bracket 32.

Here, a connecting pipe 34 is mounted at the outside of the divided reflecting block 30 in order to connect the cooling waterway formed at the inside of reflecting device 26 to it.

Figure 6A:
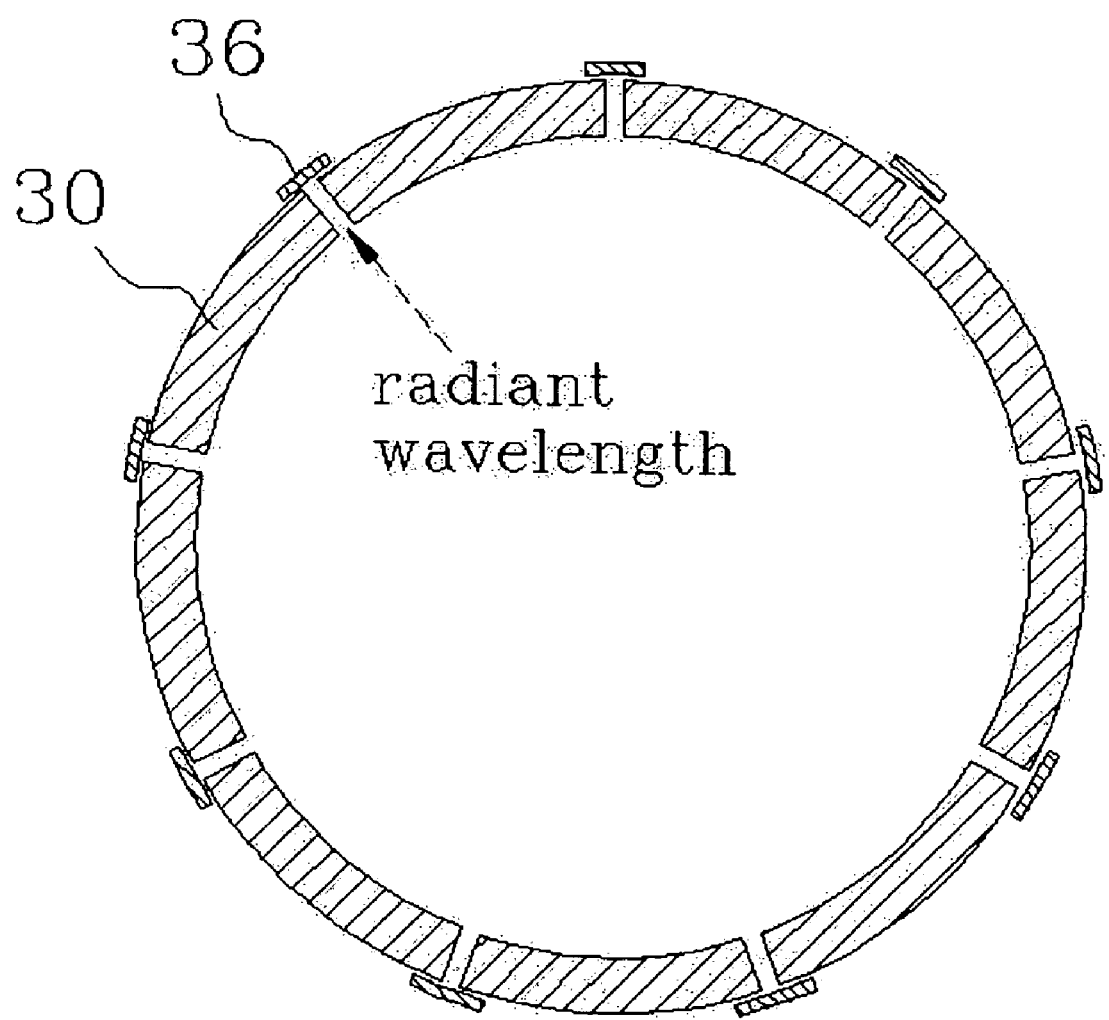
FIG. 6A through FIG. 6D are explanatory views illustrating a reflecting device having a shielding means according to the present invention.

Also, since the reflecting block 30 is divided according to each heating unit 12, it is necessary to prevent the radiant wave from being emitted outside through the boundary thereof. Accordingly, as shown in FIG. 6a, a plurality of shielding plates is formed at the boundary regions between the reflecting blocks 30.

Moreover, in order to prevent the radiant wave from being emitted outside through the boundary thereof, the reflecting block 30 is adjacently connected to another reflecting block 30 through a radiant wave shielding slit 38 between them.

Figure 6B:
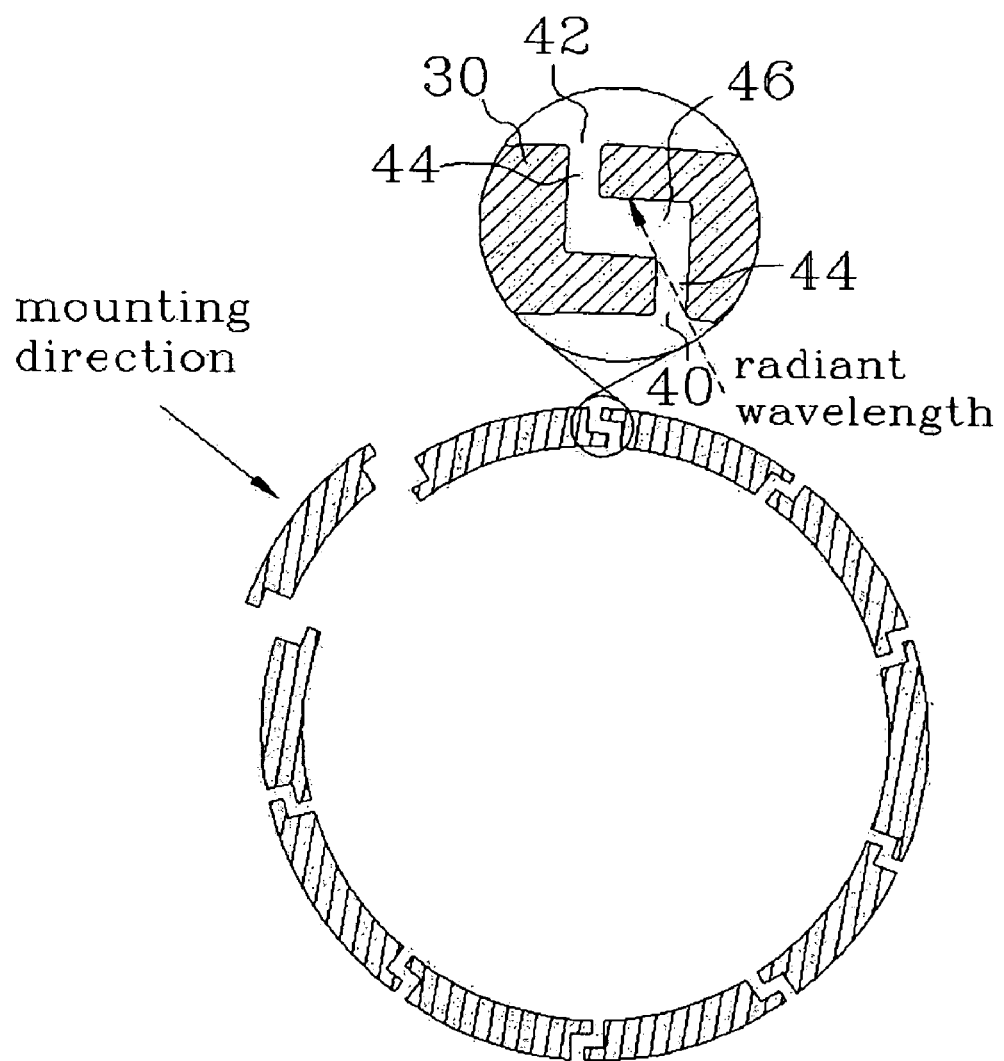

Concretely, as shown in FIG. 6b, the radiant wave shielding slit 38 includes an inlet slit 40 formed at the reaction chamber side 1, an outlet slit 42 deviated from the inlet slit 40 at a predetermined angle, first shielding slit portions 44 extending from the inlet and outlet slit portions 40 and 42 respectively, and a second shielding slit portion 46 between the first shielding slit portions 44 and formed at the circumferences of the concentric circle of the reflecting block 30 in order to constitute bent prominence and depression portions and connect them to each other.

Here, in order to attach and deattach any one reflecting block 30, the neighboring reflecting block 30 may be first attached and deattached thereto.

However, since the reflecting block 30 is in the shape of a cylinder with a wide upper portion and a narrow lower portion, although it has the radiant wave shielding slit 38, it can be attached and deattached to the neighboring reflecting block 30 independently.

Figure 6C:
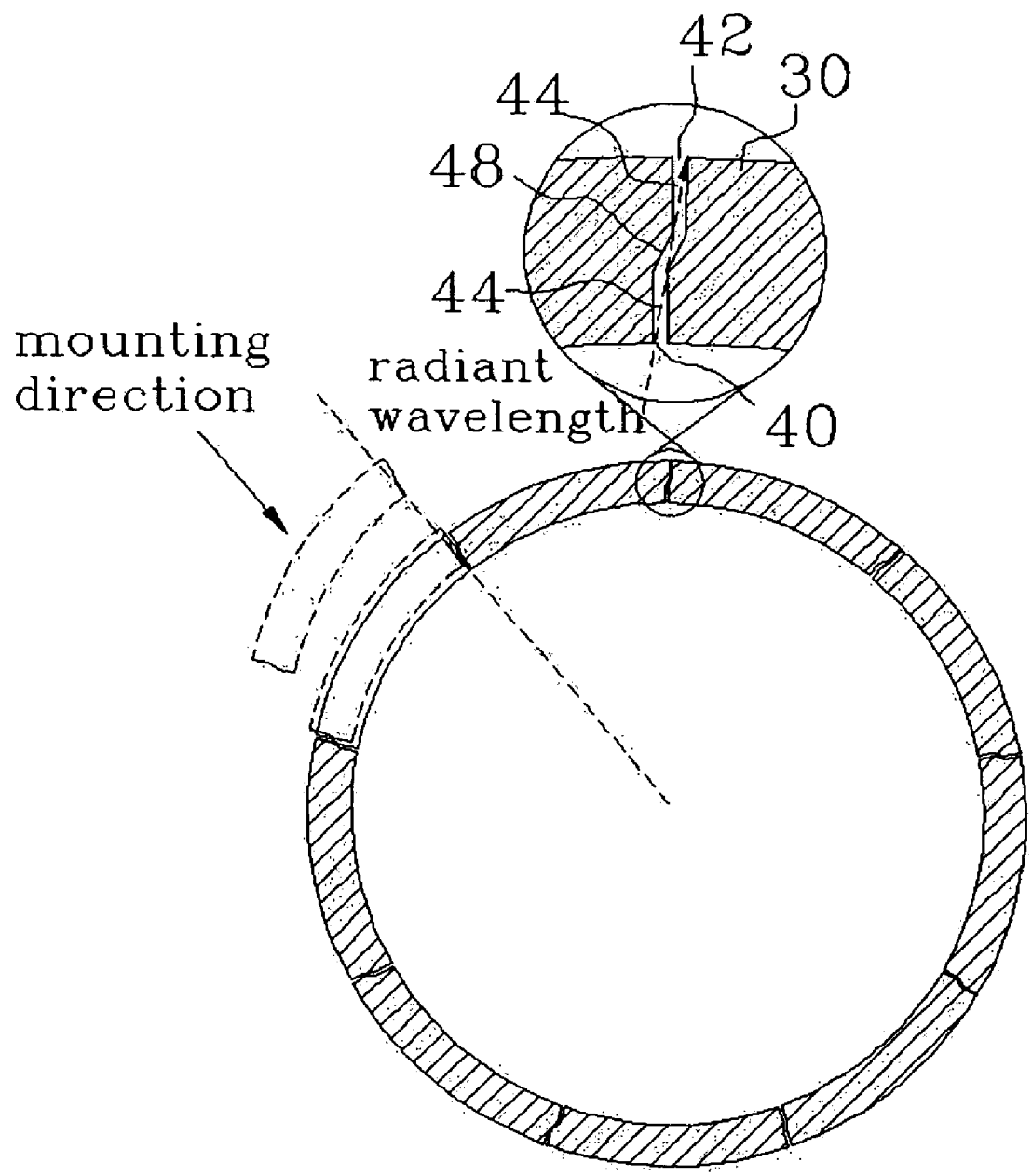

As shown in FIG. 6c, the radiant wave shielding slit 38 according to another embodiment of the present invention includes an inlet slit 40 formed at the reaction chamber side 1, an outlet slit 42 deviated from the inlet slit 40 at a predetermined angle, first shielding slit portions 44 extending from the inlet 40 and outlet slit portions 40 and 42 respectively, and a second slanted slit portion 48 slanted between the first shielding slit portions 44 in order to allow the reflecting blocks 30 to be attached and deattached and shield the remnant radiant wave radiated through the inlet slit 40 and the first shielding slit portion 44.

Figure 6D:
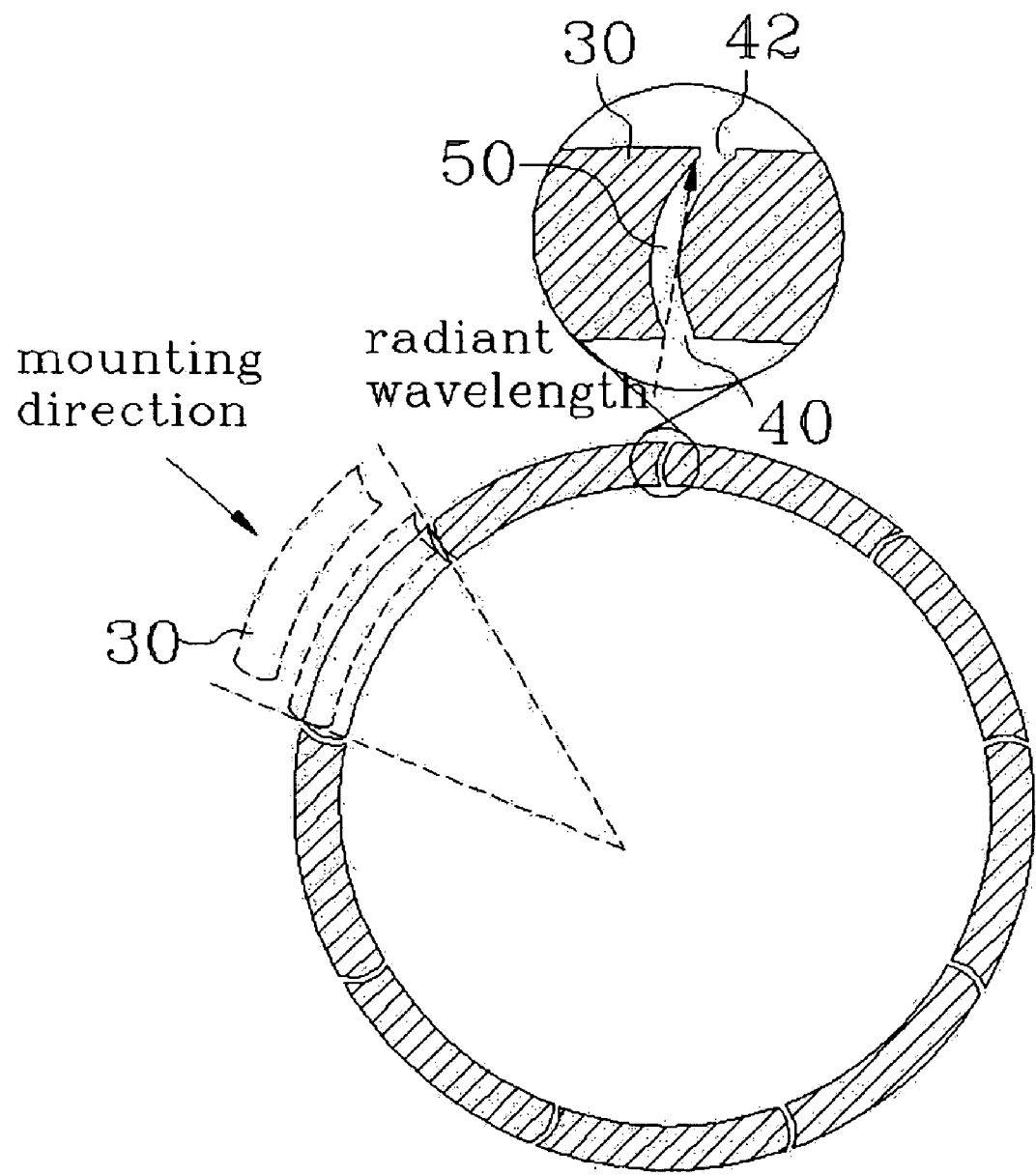

In the meantime, As shown in FIG. 6d, the radiant wave shielding slit 38 according to further another embodiment of the present invention includes an inlet slit 40 formed at the reaction chamber side 1, an outlet slit 42 deviated from the inlet slit 40 at a predetermined angle, and a shielding slit 50 bent between the inlet slit 40 and the outlet 42 in order to allow the reflecting blocks 30 to be attached and deattached and shield the emission of the radiant wave.

As shown in FIG. 5, a turning member 52 is formed at the lower portion of the reflecting blocks 30 so as to escape the interference with the peripheral device.

Concretely, the turning member 52 such as a thrust bearing is formed at the lower portion of the reflecting blocks 30 and a lower combination panel 54 is formed thereon. Also, the reflecting blocks 30 are mounted on the lower combination panel 54 and an upper combination panel 56 is formed on the reflecting blocks 30 to constitute the reflecting device 26 of a cylinder shape.

Here, where the reflecting blocks 30 are coupled to each other through the shielding plate as described above, the upper combination panel 56 may be removed. Also, where an upper plate for directly fixing to the reflecting blocks 30 is formed at the turning member 52, the lower combination panel 54 can be also removed.

As described above, in the present invention, the heating apparatus for a RTP (Rapid Thermal Process) is formed at the batch type reaction chamber.

That is, in order to form the divided heating areas T at right angles in the batch type reaction chamber, the pair of heating units 12 having a divided possession space is formed (note FIG. 2 and FIG. 3).

The heating units 12 are arranged along the outer circumference of the reaction chamber 1 and serve to heat the process space thereof. The pair of heating units 12 is formed at right angles in the batch type reaction chamber to constitute one heater 14.

Here, each heat unit 12 of the heater 14 includes the separate supplying line and thermostat 10.

Accordingly, each heat unit 12 of the heater 14 has different caloric values each other according to the divided areas.

Also, the heaters 14 includes a plurality of heat units 12 having different height and caloric value at right angles according to the divided areas. Here, one heating group 16 includes the plurality of heaters 14 having the pair of heat unit 12 having a gradually different height at right angles.

Also, the plurality of the heating group 16 is mixed with each other to be formed at the entire outer circumference of the reaction chamber 1. Accordingly, the heating apparatus having different heating areas T is provided in the reaction chamber 1.

Here, the same heating groups 16 are repeatedly arranged. Also, since the same heating units 12 having the same heating area, it is preferred that the same heating units 12 of the heating groups 16 are interlocked to each other.

Accordingly, in the heating group 16, the same heating units 12 share one supplying line and one thermostat with each other.

As shown, one heating group includes three heaters 14 in charge of three heating areas T1, T2 and T3. The entire heating apparatus includes three heating groups. However, the present invention is limited to the number and the arrangement thereof. The number and the arrangement thereof may be changed according to the entire volume of the process space and the caloric value.

In the meantime, in order to escape the supplying line and the ground line from the heating area, the shape of the heating unit 12 is a character "L" as seen from the side view thereof. Also, preferably, the end portion of the heat unit 12 is penetrated through the reflecting block to be arranged outside.

Also, in the heating unit 12 of a character "U", the horizontal connecting portion of the heating unit 12 may be the additional heating portion 20 for increasing the caloric value thereof.

One heating group 16 has three heating areas and the temperature of the heating areas can be controlled by means of the thermostat.

For example, since the heat is concentrated on the upper portion of the batch type reaction chamber as described above, if the heating temperature is T1<T2<T3 in the heating areas, the heating temperature of the heat unit H1 is increased below a standard heating temperature and the heating unit H3' is heated in such a manner that the temperature of T3 is higher than that of T1.

Also, T2 area may be vertically subdivided into two areas T2-1 and T2-2 at the center thereof.

Accordingly, it can control the uniform temperature incline of the entire process space of the reaction chamber 1 through the heating apparatus. Here, the temperature control of the reaction chamber 1 can be performed by means of a controller (not shown).

That is, a thermometer for detecting a temperature of the heating area is connected to an input port of the controller. Accordingly, the feedback is performed in the controller according to the set temperature of the reaction chamber and a temperature control mode is formed in order to equalize the temperature of each heating area. Also, the output port of the controller having the temperature control mode is connected to the thermostats of each heating unit.

Here, in order to perform the feedback, firstly the heating units are driven in order to establish the proper range of the temperature. Thereafter, the thermostats control the caloric values of each heating unit so as to maintain the range of the set temperature.

In order to perform the RTP (Rapid Thermal Process) by means of the heating apparatus, the reflecting device for assisting the RTP and preventing the heat damage of the periphery device is formed, without using the conventional adiabatic device surrounding the heating apparatus (note FIG. 4).

The reflecting device serves to concentrate the radiant heat of the heating apparatus made of a MoSi2 and so forth on the reaction chamber and prevent the heat damage of the periphery device arranged outside the reaction chamber through the radiant heat irradiated radially from the heating apparatus.

The reflecting device 26 includes the reflecting plate 22 for reflecting the radiant heat of the heating apparatus 18 and a supporting structure for supporting the reflecting plate.

Concretely, the reflecting block 28 of a cylinder shape as the supporting structure surrounds the outside of the heating apparatus 18 arranged along the circumference of the batch type reaction chamber 1.

Here, the material of the reflecting block is an aluminum alloy. Also, the noble metal having a good reflexibility such as a gold or a silver is coated on the reflecting plate 22 so as to ensure a reflecting coating layer for reflecting a radiant wave.

In the meantime, the reflecting block 30 includes a cooling device for preventing the heat damage of the heating apparatus 18. Also, in the cooling device, the cooling waterway 24 for exchanging the heat and preventing the heat damage owing to a heating of the heating apparatus 18 is formed.

The cooling waterway 24 can be manufactured by various methods. For example, where the reflecting block 30 is manufactured by a die-casting manner, the cooling waterway 24 is formed by a general manufacturing method.

Also, the passage of a pipe type is vertically formed at the reflecting block 30 and the punched inlet thereof is closed by a cap, and then it can be communicated with the connecting pipe for connecting to outside, so that the cooling waterway 24 can be formed at the manufactured reflecting block 30.

Accordingly, the reflecting plate 22 is arranged at the outside of the heating apparatus 18. Also, the reflecting block 30 is separated from the heating apparatus through the bracket 32 so at to decrease the thermal conduction owing to the direct contact between the heating apparatus 18 and the reflecting plate 22.

Also, since the heating apparatus 18 according to the present invention includes a plurality of heating units 12, it can obtain the gain in exchange establishment.

That is, when the heating apparatus 18 is damaged, it is possible to repair it through exchanging of only damaged heating unit 12. Here, it can check out the damage of the heating unit 12 through the electric test of each heating unit 12.

When one heater 14 is damaged, since the diameter of the semiconductor substrate is about 12 inches and the operation space of a cylinder type of surrounding the circumference of the reaction chamber 1 for treating the semiconductor substrate more than one hundred pieces is very small and narrow, it is difficulty for the worker to repair it in the inside of the reflecting block 30.

For this reason, each heating unit 12 according to the present invention corresponds to one reflecting block 30. Accordingly, it is possible to exchange the damaged heating unit 12 by means of removing of one reflecting block 30 (note FIG. 5).

In this case, since the plurality of reflecting blocks 30 is divided according to the number of the heating unit 12, the separate supporting structures are required so as to maintain the cylindrical shape thereof. Accordingly, the lower combination panel 54 and the upper combination panel 56 are formed at the lower and upper portion thereof respectively.

Especially, the lower combination panel 54 is connected to the turning member 52 serving to control the exchanging direction freely.

In the meantime, since each reflecting block 30 is formed per each heating unit 12 and the plurality of reflecting blocks 30 is radially formed, when one reflecting block 30 is removed, it can cause the interference with another means (structure).

Accordingly, in order to exchange all reflecting blocks in one-way direction, it is necessary for the reflecting blocks 30 to be rotated.

In the turning member 52 such as the thrust bearing, a rolling bearing is inserted between two turning plate to be rotated around a shaft. Here, where the upper plate of the turning plate for directly fixing to the reflecting blocks 30 is formed at the turning member 52, the lower combination panel 54 can be removed.

Also, the connecting pipe 34 is mounted at the outside of the divided reflecting block 30 in order to connect the cooling waterway formed at the inside of reflecting device 26 to it.

Moreover, since the plurality of reflecting blocks 30 is divided according to the number of the heating unit 12, it is necessary to close the boundary between each reflecting blocks 30.

That is, because a slit (gap) can be formed at the boundary between each reflecting blocks 30, the radiant heat of the heating apparatus 18 is leaked out through the slit and the leaked heat can damage the periphery device.

As shown in FIG. 6a, the slits are blocked by the plurality of shielding plates 36. Where the reflecting blocks 30 are coupled to each other through the shielding plate 36, the upper combination panel 56 may be removed.

Here, the combination between each shielding plate 36 and each reflecting block 30 can be performed through a general coupling means, for example nut holes (not shown) and bolts (not shown).

In the meantime, when each reflecting block 30 is attached and deattached by means of the shielding plate 36, it has difficulty in attaching and deattaching the both shielding plates 36 connected to the neighboring reflecting blocks 30.

Accordingly, in the present invention, the slits are bent to shield the linear paths, so that it can prevent the radiant heat (wavelength) from being emitted to outside.

That is, since the plurality of reflecting blocks 30 is divided according to the number of the heating unit 12, in order to prevent the radiant wave from being emitted outside through the boundary thereof, the reflecting block 30 is adjacently connected to another reflecting block 30 through the radiant wave shielding slit 38 between them.

Concretely, as shown in FIG. 6b, the radiant wave shielding slit 38 includes the inlet slit 40 formed at the reaction chamber side 1, the outlet slit 42 deviated from the inlet slit 40 at a predetermined angle, the first shielding slit portions 44 extending from the inlet and outlet slit portions 40 and 42 respectively, and the second shielding slit portion 46 between the first shielding slit portions 44 and formed at the circumferences of the concentric circle of the reflecting block 30 in order to constitute bent prominence and depression portions and connect them to each other.

That is, the plurality of reflecting blocks 30 can be assembled with each other in the form of a puzzle type of prominence and depression. The radiant wave shielding slits 38 of prominence and depression type are bent to shield the linear paths of the radiant wave, so that it can prevent the forming of the linear path between the inlet slit 40 and the outlet slit 42.

Therefore, although the plurality of shielding plates 36 is not provided, it can prevent the radiant heat from being emitted outside through the reflecting blocks 30.

In this case, the stepped portion formed at the outside of the reflecting block 30 serves to easily attach and deattch the reflecting blocks 30 without the interference with the periphery thereof. Also, the stepped portion formed at the inside of the reflecting block 30 serves to easily deattch the reflecting blocks 30 after any one of the neighboring reflecting block 30 is first deattached thereto.

In the meantime, since the reflecting block 30 is in the shape of a cylinder having a sufficient thickness for providing the cooling waterway, although it has the radiant wave shielding slit 38, it can be attached and deattached to the neighboring reflecting block 30 independently.

That is, the boundaries between each reflecting block 30 of the reflecting device are formed at the circumferences of the concentric circle of the reflecting block 30. Also, each reflecting block 30 has enough thickness between the inner and outer circumferences of the reflecting block 30 to form the cooling waterway 24.

Also, since the reflecting block 30 has a circular ark with a wide upper portion and a narrow lower portion, it can be attached and deattached to the neighboring reflecting block 30 independently.

Here, in order to deattach any one reflecting block 30 having the prominence and depression portions, the deattachment of the neighboring reflecting block can be firstly demanded.

However, since the reflecting block 30 is in the shape of a cylinder with a wide upper portion and a narrow lower portion, although it has the radiant wave shielding slit 38, it can be deattached to the neighboring reflecting block 30 independently.

As shown in FIG. 6c, the radiant wave shielding slit 38 according to another embodiment of the present invention includes the inlet slit 40 formed at the reaction chamber side 1, the outlet slit 42 deviated from the inlet slit 40 at a predetermined angle, first shielding slit portions 44 extending from the inlet 40 and outlet slit portions 40 and 42 respectively, and a second slanted slit portion 48 slanted between the first shielding slit portions 44 in order to allow the reflecting blocks 30 to be attached and deattached and shield the remnant radiant wave radiated through the inlet slit 40 and the first shielding slit portion 44. Here, the first shielding slit portions 44 and the second slanted slit portion 48 are located at the same radial line thereof respectively.

That is, the second slanted slit portion 48 for shielding the linear extending line is formed between the inlet and outlet slits 40 and 42, so that the leakage of the radiant wave is prevented. Also, since the outer circumference of each reflecting block 30 is longer than the inner circumference thereof in length, it can be independently deattached to the neighboring reflecting block 30 according to the slanted direction thereof.

Here, the deattachment direction of each reflecting block 30 is deviated from the center of the cylinder type about the central portion thereof. That is, the deattachment of each reflecting block 30 is performed on the path line of the protruded first shielding slit portion 44 at the neighboring reflecting blocks 30, so that each reflecting blocks 30 can be easily attached and deattached to the neighboring reflecting blocks 30 without the interference with the neighboring reflecting blocks 30.

In the meantime, As shown in FIG. 6d, the radiant wave shielding slit 38 according to further another embodiment of the present invention includes the inlet slit 40 formed at the reaction chamber side 1, the outlet slit 42 deviated from the inlet slit 40 at a predetermined angle, and the shielding slit 50 bent between the inlet slit 40 and the outlet 42 in order to allow the reflecting blocks 30 to be attached and deattached and shield the emission of the radiant wave. Here, the shielding slits 50 are located at the same radial line thereof respectively.

As shown, the curved shielding slit 50 for shielding the leakage path is formed between the inlet and outlet slits 40 and 42, so that the leakage of the radiant wave is prevented. Also, since the outer circumference of each reflecting block 30 is longer than the inner circumference thereof in length, it can be independently deattached to the neighboring reflecting block 30 according to the curved surface thereof.

Here, the deattachment direction of each reflecting block 30 is deviated from the center of the cylinder type about the central portion thereof. As shown, the deattachment of each reflecting block 30 is performed in the direction of the connecting line between the interesting point of the input and output slits 40 and 42 and the center thereof, so that each reflecting blocks 30 can be easily attached and deattached to the neighboring reflecting blocks 30 without the interference with the neighboring reflecting blocks 30.

As can be seen from the foregoing, in the heating system of the batch type reaction chamber using the heater for RTP, the heating group having the plurality of heaters for forming divided heating areas at right angles and having a pair of heating units as the heating element connected to each supplying line through separate thermostats is provided, so that each heat unit has different height and caloric value at right angles according to the divided areas, whereby it can control the uniform temperature incline of the entire process space of the reaction chamber.

Also, the reflecting device is manufactured by the aluminum blocks, so that its weight is light and its establishment is simple.

Moreover, the reflecting plates are formed by each heating unit, so that the change of the heating unit can be simple.

Furthermore, the divided reflecting blocks are adjacently connected to another reflecting block through the radiant wave shielding slit between them, so that the leakage of the radiant wave can be prevented and the reflecting blocks can be separately attached and deattached to each other.

Also, the turning member is formed at the lower portion of the reflecting blocks, whereby it can be easily attached and deattached.

While this invention has been described in connection with what are presently considered to be the most practical and preferred embodiments, it is to be understood that the invention is not limited to the disclosed embodiments and the drawings, but, on the contrary, it is intended to cover various modifications and variations within the spirit and scope of the appended claims.

What is claimed is:

1. A heating system of a batch type reaction chamber comprising:
    a reaction chamber is configured to form a process space;
    a heating apparatus having a plurality of heating groups is formed along an outer circumference of the reaction chamber, wherein each of the heating groups has a plurality of heating units formed to divide heating areas at right angles and each of the heating groups is connected to each supplying line having a separate thermostat, wherein each of the heating units is in the shape of a character "U" and a horizontal connecting portion of each of the heating units is an additional heating portion;
    a reflecting device having a reflecting plate is configured to reflect the radiant heat radiated from the heating apparatus into an inside of the reaction chamber arranged around the heating apparatus; and
    a cooling waterway is configured to exchange a heat and to prevent heat damage.

2. A heating system according to claim 1 wherein, the reflecting device includes a divided reflecting block that is mounted at each of the heating units through a bracket.

3. A heating system according to claim 2 further comprising:
    a connecting pipe is mounted at an outside of the divided reflecting block in order to connect the cooling waterway formed at an inside of the reflecting device.

4. A heating system according to claim 2 further comprising:
    a plurality of shielding plates are configured to assemble the reflecting block that is formed at the boundary regions between the reflecting blocks.

5. A heating system according to claim 2 wherein, the reflecting block is adjacently connected to another reflecting block through a radiant wave shielding slit between them in order to prevent the radiant wave from being emitted outside through the boundary thereof.

6. A heating system according to claim 5 wherein, the radiant wave shielding slit further comprising:
    an inlet slit is formed at the reaction chamber side,
    an outlet slit deviated from the inlet slit is formed at a predetermined angle,
    a first shielding slit portion is extended from the inlet and the outlet slit respectively; and
    a second shielding slit portion, formed between the first shielding slit portion and circumference of the concentric circle of the reflecting block, is configured to bent prominence and depression portions and to connect them to each other.

7. A heating system according to claim 5 wherein, the radiant wave shielding slit further comprising:
    an inlet slit is formed at the reaction chamber side,
    an outlet slit deviated from the inlet slit is formed at a predetermined angle,
    a first shielding slit portion is extended from the inlet and the outlet slit respectively; and
    a second slit portion is slanted between the first shielding slit portion in order to allow attached and detach the reflecting blocks and to shield the remnant radiant wave radiated through the inlet slit and the first shielding slit portion.

8. A heating system according to claim 5 wherein, the radiant wave shielding slit further comprising:
    an inlet slit is formed at the reaction chamber side,
    an outlet slit deviated from the inlet slit is formed at a predetermined angle; and
    a shielding slit is bent between the inlet slit and the outlet in order to attach and detach the reflecting blocks and to shield the emission of the radiant wave.

9. A heating system according to claim 2 further comprises a turning member that is formed at the lower portion of the reflecting blocks so as to escape the interference with the peripheral device and an upper combination panel is configured on the reflecting blocks to form a cylindrically shaped reflecting device.

10. A method for making a batch type reaction chamber using a heating system comprising:

forming a reaction chamber for making a process space;

forming a heating apparatus using a plurality of heating groups formed along an outer circumference of the reaction chamber, wherein each of the heating groups has a plurality of heating units for dividing heating areas at right angles and each of the heating groups is connected to each supplying line having a separate thermostat, wherein each of heating units is in the shape of a character "U" and a horizontal connecting portion of the each of the heating units is an additional heating portion;

forming a reflecting device having a reflecting plate for reflecting the radiant heat of the heating apparatus toward an inside of the reaction chamber arranged around the heating apparatus; and forming a cooling waterway for exchanging a heat and preventing a heat damage.

* * * * *